(12) United States Patent
Wimpenny (10) Patent No.: US 8,476,976 B2
(45) Date of Patent: Jul. 2, 2013

(54) MULTI-STAGE AMPLIFIER

(75) Inventor: Gerard Wimpenny, Cambourne (GB)

(73) Assignee: Nujira Limited, Cambourne, Cambridge (GB)

( * ) Notice: Subject to any disclaimer, the term of this patent is extended or adjusted under 35 U.S.C. 154(b) by 0 days.

(21) Appl. No.: 12/988,400

(22) PCT Filed: Apr. 9, 2009

(86) PCT No.: PCT/EP2009/054276
§ 371 (c)(1),
(2), (4) Date: Dec. 17, 2010

(87) PCT Pub. No.: WO2010/115465
PCT Pub. Date: Oct. 14, 2010

(65) Prior Publication Data
US 2011/0090007 A1   Apr. 21, 2011

(51) Int. Cl.
*H03G 3/20*   (2006.01)
(52) U.S. Cl.
USPC .......................................... 330/127; 330/133
(58) Field of Classification Search
USPC .................................. 330/127, 133, 136, 297
See application file for complete search history.

(56) References Cited

U.S. PATENT DOCUMENTS

| | | | |
|---|---|---|---|
| 5,942,938 A | 8/1999 | Myers et al. | |
| 6,157,253 A | 12/2000 | Sigmon et al. | |
| 7,212,069 B2 * | 5/2007 | Schell et al. | 330/10 |
| 7,378,909 B2 * | 5/2008 | Tomizawa | 330/285 |
| 2002/0136325 A1 | 9/2002 | Pehlke et al. | |
| 2003/0222709 A1 | 12/2003 | Kim | |
| 2005/0134396 A1 | 6/2005 | Pehlke et al. | |

OTHER PUBLICATIONS

Lorenzo, Carlos, "PCT Application No. PCT/EP2009/054276 International Preliminary Report on Patentability Oct. 20, 2011", , Publisher: PCT, Published in: PCT.

Robert Barrell, "International Search Report for International Aplication No. GB0807134.2", Jun. 29, 2009, Publisher: British Patent Office, Published in: GB.

Murae et al., "High Power S-Band Solid-State Amplifiers for Surveillance and Traffic Control Radars", "XP-001067363", May 20, 2001, pp. 653-656, Publisher: 2001 IEEE MTT-S International Microwave Symposium, Published in: New York, New York.

* cited by examiner

*Primary Examiner* — Steven J Mottola
(74) *Attorney, Agent, or Firm* — Kaplan Breyer Schwarz & Ottesen, LLP (57) ABSTRACT

There is disclosed a power supply stage, and a corresponding method, comprising: a plurality of amplifiers for amplifying an input signal, each amplifier receiving a power supply voltage; a common selection means for selecting one of a plurality of power supply voltages in dependence on a reference signal representing a desired power supply voltage; and a plurality of adjusting means, corresponding to the plurality of amplifiers, adapted to generate an adjusted selected power supply voltage for a respective amplifier tracking the reference signal in dependence on the one selected power supply voltage and the reference signal.

11 Claims, 6 Drawing Sheets

MULTI-STAGE AMPLIFIER

BACKGROUND TO THE INVENTION

1. Field of the Invention

The present invention relates to amplification stages for providing a modulated supply voltage, and particularly to such amplification stages organised to provide higher power than can be achieved in a single stage by using an arrangement known as a 'corporate structure' amplifier.

2. Description of the Related Art

It is known to provide a modulated power supply for providing a supply voltage to an amplification stage, such as a radio frequency (RF) amplification stage. An example of a particularly advantageous modulated power supply stage can be found in United Kingdom Patent No. 2398648.

In this advantageous modulated power supply stage there is provided an efficient technique for tracking the supply voltage to an RF amplifier in dependence on the RF input signal to be amplified by the amplifier. A first control loop tracks the envelope of the input signal, representing a desired supply voltage for the amplification stage, and selects one of a plurality of available supply voltages in dependence thereon. A second control loop tracks the envelope of the input signal and the actual output signal, and generates an error signal representing the difference there between. This error signal is combined with the selected supply voltage to provide an adjusted selected supply voltage for the amplification stage. The first control loop is a low frequency loop, and the second control loop is a high frequency loop.

Such an improved modulated supply stage offers significant advantages and improvements in delivering a highly accurate tracking (or tracked) power supply to an amplifier, with associated efficiency improvements.

It is also known, in amplifying signals such as RF signals, to split the input signal into portions, and then amplify each portion in a separate power amplifier, before recombining the amplified portions. The use of multiple power amplifiers to amplify a signal in this way enables a more powerful signal to be delivered than could otherwise be delivered. Typically such an amplified signal is delivered to an antenna of an RF transmitter.

Arrangements in which a signal is split in this way for amplification by multiple parallel amplifiers, before recombining, are known as 'corporate structures'.

In the prior art highly accurate tracking power supply arrangement found in United Kingdom Patent No. 2398648, if the power supply stage is adapted for a corporate structure to deliver a power supply to n power amplifiers, then the power of each of the low frequency loop and the high frequency loop must be increased by a factor n. This has a negative effect on performance. The loops must be made physically larger. Layout problems may arise on the circuit board, with longer tracks needed to some power amplifiers. The maximum number of amplifiers which may be combined may also be restricted due to physical constraints of the power amplifiers on the feed network through which the modulated supply is delivered.

Alternatively a single modulated power supply may be provided for each single amplifier stage. This requires a large amount of replication of circuits. This adds to the cost and size of the implementations, and thus introduces of its own inefficiencies. In this arrangement, to achieve the benefits of an efficient, highly accurate tracking power supply for each single amplifier requires a high component count and associated cost.

As noted above, in a corporate structure with n amplifiers and n associated modulated supplies, regardless of the specific modulated supply implementations, disadvantages of performance, cost and size may be encountered.

It is an aim of the invention to provide a technique to enable some or all of the benefits of high accuracy tracking power supplies to be obtained in arrangements in which multiple power amplifiers are implemented in parallel.

SUMMARY OF THE INVENTION

In accordance with the invention there is provided a power supply stage, comprising: a plurality of amplifiers for amplifying an input signal, each amplifier receiving a power supply voltage; a common selection means for selecting one of a plurality of power supply voltages in dependence on a reference signal representing a desired power supply voltage; and a plurality of adjusting means, corresponding to the plurality of amplifiers, adapted to generate an adjusted selected power supply voltage for a respective amplifier tracking the reference signal in dependence on the one selected power supply voltage and the reference signal.

The common selection means may be a switched voltage supply. The plurality of adjusting means may each comprise an error correction means. Each adjusting means may be adapted to receive the adjusted selected power supply and compare it with the reference signal, to thereby generate an error signal to be added to the selected power supply voltage.

The power supply stage may further comprise means for providing the reference signal to each adjusting means, which means may provide a plurality of copies of the reference signal for the respective adjusting means.

The power supply stage may further comprise a plurality of said common selection means each associated with a plurality of amplifiers and a plurality of adjusting means.

The power supply stage may further comprise: means for distributing the reference signal to the plurality of common selection means; means for distributing the reference signal to the plurality of adjusting means associated with each common selection means; and means for distributing the reference signal distributed to each plurality of adjusting means to the individual adjusting means.

The power supply stage may further comprise means for controlling the timing of the reference signal at each of the adjusting means such that the adjusted supply voltage for each amplifier is time-aligned to the signal being carried by each amplifier. The signal being carried by each amplifier refers to the signal which each amplifier is amplifying, i.e. it's input signal. The signal being carried by each amplifier is, in a preferred embodiment, a radio frequency (RF) signal, each amplifier being an RF amplifier.

The means may be adapted to further control the timing of the reference signal at the common selection means.

In accordance with the invention there is further provided a method for providing a power supply voltage to each of a plurality of amplifiers arranged to amplify an input signal, comprising: selecting one of a plurality of power supply voltages in dependence on a reference signal representing a desired power supply voltage; and generating a plurality of adjusted selected power supply voltages for the respective plurality of amplifiers, each tracking the reference signal in dependence on the one selected power supply voltage and the reference signal.

The step of generating a plurality of adjusted selected power supply voltages may comprise receiving the adjusted selected power supply and comparing it with the reference signal, and in dependence thereon generating an error signal to be added to the selected power supply voltage.

The method may further comprise providing a plurality of copies of the reference signal for generating a plurality of adjusted selected power supply voltages.

The method may further comprise a plurality of said selecting one of a plurality of power supply voltages steps, and an associated plurality of generating a plurality of adjusted selected power supply voltages steps.

The method may further comprise: distributing the reference signal for the plurality of selecting step; distributing the reference signal for the plurality of generating steps associated with each selecting step; and distributing the reference signal distributed to each plurality of generating steps to the individual generating steps.

The method may further comprise controlling the timing of the reference signal for each of the adjusting steps such that the adjusted supply voltage for each amplifier is time-aligned to the input signal for each amplifier.

An advantage of the invention is that cost and space savings are achieved by separating out the two control loops. The low frequency control loop, which is relatively slow, is separated out from the high frequency control loop. The low frequency control loop is provided as a common control loop for a set of amplifiers. The common control loop can be adapted to be high-powered, to deliver an output to multiple amplifiers, without suffering a loss of performance. An individual high frequency loop is provided for each amplifier of the set. The provision of an individual high frequency loop for each amplifier allows the high accuracy benefits provided by advantageous arrangements to be substantially maintained, without incurring significant overheads in consuming space and an increased component count by replicating circuitry.

BRIEF DESCRIPTION OF THE FIGURES

The invention will now be described by way of example with reference to embodiments and the following Figures in which.

DESCRIPTION OF PREFERRED EMBODIMENTS

The invention is now described below by way of example with reference to non-limiting embodiments.

Figure 1:
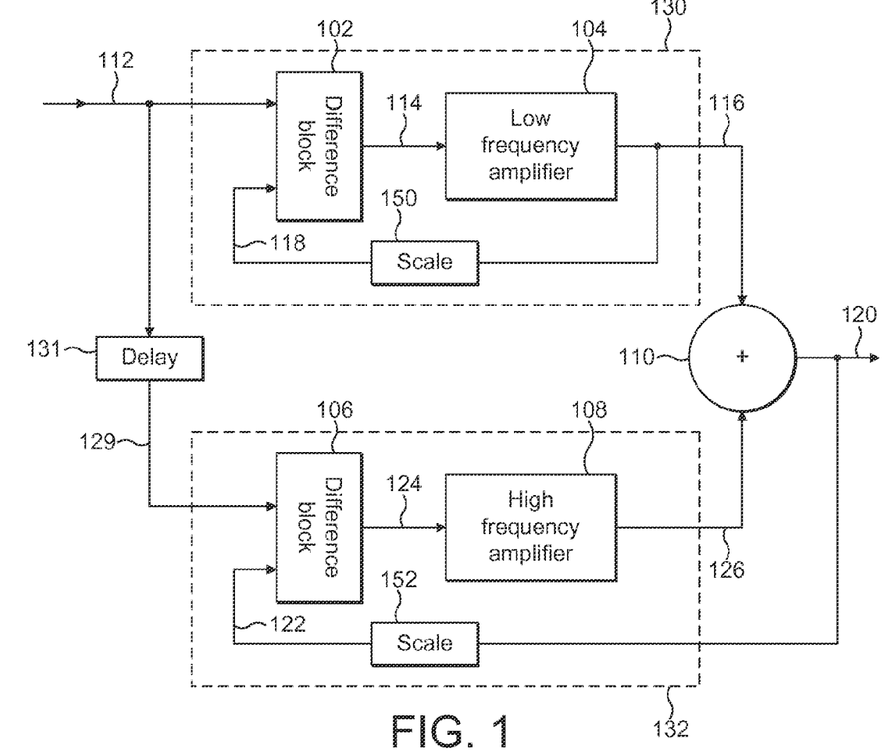
FIG. 1 illustrates a preferred exemplary dual-loop control system.

FIG. 1 illustrates an exemplary dual-loop control system in accordance with the principles set out in United Kingdom Patent No. 2398648. United Kingdom Patent No. 2398648 is incorporated herein by reference. A difference block 102 and a low frequency amplifier 104 define a first path 130. The first path may also be referred to as a first control path, or a main path. A difference block 106 and a high frequency amplifier 108 define a second path 132. The second path may also be referred to as a second control path or an error correction path. In general, the second path removes an error from the first path, as will be understood from the following description.

A summer or combiner 110 is provided to combine the two control paths. The objective of the control system is to provide on an output line 120 a signal which is an accurate replica of an input signal provided on line 112. The control system preferably provides an output signal on line 120 having a much larger current available than is associated with the input signal on line 112. Such a system may be advantageously used as a high efficiency modulated or tracking power supply, with a load connected to the output signal line 120.

The input signal on line 112 provides a first input to the difference block 102. The difference block 102 forms an output on line 114 to the low frequency amplifier 104. The output of the low frequency amplifier 104 on line 116 forms a first input to the combiner 110, and is also fed back to form a second input to the difference block 102 on line 118 via a scaling block 150.

The input signal on line 112 provides a first input to the difference block 106 on line 129 via a delay block 131. The difference block 106 forms an output on line 124 to provide an input to the high frequency amplifier 108. The high frequency amplifier 108 provides an output on line 126 which forms a second input to the combiner 110. The combiner 110 combines the signals on lines 116 and 126 to form the output signal on line 120. The output signal on line 120 is fed back to form the second input to the difference block 106 on line 122 via a scaling block 152.

In an example application where the input signal on line 112 is an envelope derived from a RF signal to be amplified, the signal has a wide frequency spectrum compared to the operating frequency bandwidth of the low frequency amplifier 104. In this system the low frequency amplifier 104 provides a large portion of the output power delivered on the output signal line 120, but is incapable of operating at the higher frequency range of the input signal. The high frequency amplifier 108 effectively operates as an error correcting or clean-up loop to provide the missing part of the output signal on line 120. The error correction or clean-up is provided by summing the signal on line 126 with the signal on line 116 to deliver a desired output signal on line 120.

In the arrangement of FIG. 1, the high frequency amplifier 108 must be able to operate over almost the full frequency range of the input signal. This creates demands on the dynamic range and fractional bandwidth of the high frequency amplifier 108, and particularly creates demands on the design of the combiner 110 which must be capable of operating at a very high fractional bandwidth.

To mitigate these problems, the delay block 131 is preferably provided in accordance with the principles discussed in United Kingdom patent application number 0803711.1.

The provision of the delay block 131 reduces the low frequency content of the signal provided to the high frequency amplifier 108 as described further below.

The delay block 131 introduces a delay into the second control path equivalent to the delay through the first control path. In the arrangement of FIG. 1 a finite delay is introduced by the control loop 130. The delay block 131 of the arrangement of FIG. 2 operates as a balancing delay, delaying the signal applied to the first input of the difference block 106 by an amount corresponding to the delay of the first control loop 130, which delay is present in the signal delivered to the second input of the difference block 106 on line 122. The balancing delay afforded by the delay block 131 is preferably substantially constant with frequency.

Thus the provision of the delay block 131 ensures that the difference block 106 provides an output on line 124 which has reduced low frequency signals.

The cancellation of the low frequency signals in this way means that the high frequency amplifier 108 is not required to amplify those signals, and the combiner 110 is not required to handle those signals on the input line 126. Thus the removal of the low frequency content in this way allows for signal coupling in the combiner 110 using, for example, a transformer or a capacitor. The use of a transformer for the combiner 110 is a particularly advantageous, and preferable, arrangement.

Preferably the delay provided by the delay block 131 is a digital delay. A digital delay is preferable as this provides a constant delay at all frequencies. A digital delay is particularly appropriate where the input signal is in digital form. The invention, and embodiments thereof, are not limited to digital delays. The delay can be implemented as an analogue network.

Figure 2:
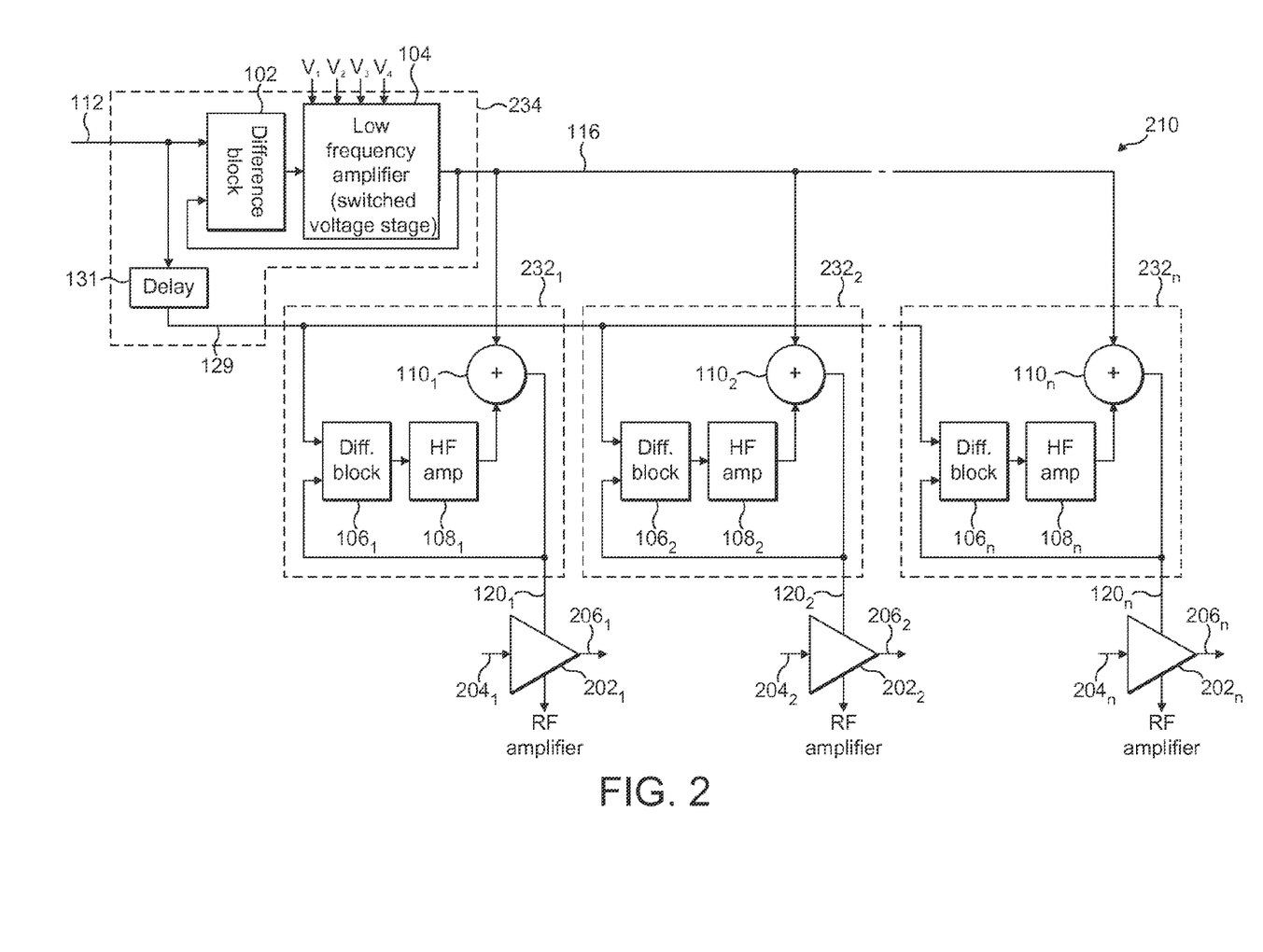
FIG. 2 illustrates schematically a dual-loop control system for a multi-stage amplifier in accordance with the principles of the invention.

With reference to FIG. 2, there is now illustrated schematically an exemplary dual-loop control system for a multi-stage amplifier arrangement in accordance with the principles of the invention, which utilises the principles of the preferred dual-loop control system of FIG. 1.

It should be noted that for ease of illustration, in the following Figures the scaling blocks 150 and 152 of FIG. 1 are not illustrated. One skilled in the art will appreciate, however, that such scaling blocks may preferably be provided.

Referring to FIG. 2, the multi-stage amplifier arrangement is generally denoted by reference numeral 210, and includes a plurality n of RF amplifiers. In FIG. 2 there is illustrated a first RF amplifier $202_1$, a second RF amplifier $202_2$, and an $n^{th}$ RF amplifier $202_n$. The respective RF amplifiers $202_1$ to $202_n$ receive an input signal on a respective input $204_1$ to $204_n$ and generate an output signal on a respective output $206_1$ to $206_n$. Each of the amplifiers $202_1$ to $202_n$ of the multi-stage amplifier arrangement 210 receives equivalent input signals on their respective inputs $204_1$ to $204_n$. The input signals may be provided by a splitter stage. The output signals on outputs $206_1$ to $206_n$ may be combined in a subsequent combiner stage.

Each RF amplifier receives, in accordance with the principles of the present invention, a modulated power supply voltage on a respective power supply line $120_1$ to $120_n$. In the example illustrated, the RF amplifiers $202_1$ to $202_n$ are further connected to ground.

In accordance with the principles of the present invention, the multi-stage amplifier arrangement 210 is provided with a single low frequency amplification stage, and n high frequency amplification stages. The single low frequency amplification stage is denoted by reference numeral 234, and comprises the low frequency amplification stage 130 of FIG. 1 together with the delay stage 131 of FIG. 1. Thus the delay stage 131 of FIG. 1 is additionally provided as a single, common stage for the multi-stage amplifier arrangement 210.

Although referred to as the low frequency amplification stage, it will be appreciated that the stage 234 includes the delay 131 which is not associated with the low frequency amplification. The stage 234 is in general a common stage for the multi-stage amplifier arrangement, but is referred to herein as the low frequency amplification stage in view of its main functional purpose.

As illustrated in FIG. 2, the low frequency amplifier 104 is a switched voltage stage. The switched voltage stage receives, in the illustrated example, four supply voltages V1 to V4. One of the supply voltages V1 to V4 is selected for output on line 116 in dependence on the magnitude of the input signal from the difference block 102. Such switched supply voltage stages are known in the art, and for example are described in GB Patent No. 2398648.

As illustrated in FIG. 2, for the multi-stage amplifier arrangement 210 a plurality n of high frequency amplification stages denoted by reference numerals $232_1$ to $232_n$ are provided. Each of the high frequency amplification stage $232_1$ to $232_n$ correspond to the high frequency amplification stage 132 of FIG. 1. In addition each of the high frequency amplification stages $232_1$ to $232_n$ includes a combiner equivalent to the combiner 110 of FIG. 1.

Although referred to as high frequency amplification stages, it will be appreciated that the stages $232_1$ to $232_n$ include the combiners $110_1$ to $110_n$ which are associated also with the low frequency amplifications outputs. The stages $232_1$ to $232_n$ are in general dedicated stages for the multi-stage amplifier arrangement, but are referred to herein as high frequency amplification stages in view of their main functional purpose.

As illustrated in FIG. 2, the common low frequency amplification stage 234 receives the input reference signal on line 112. The common low frequency amplification stage 234 provides the output signal on line 116 in accordance with the arrangement of FIG. 1.

Each of the high frequency amplification stages $232_1$ to $232_n$ receive two inputs, being the output on line 116 of the low frequency amplification stage 234, and the output on line 129 which is the delayed version of the input reference signal. As noted above, each of the high frequency amplification stages $232_1$ to $232_n$ generates a respective modulated supply voltage on lines $120_1$ to $120_n$ in dependence on the signals on lines 116 and 129.

Each of the high frequency amplification stages $232_1$ to $232_n$ includes a difference block $106_1$ to $106_n$ respectively corresponding to the difference block 106 of FIG. 1, and a high frequency amplifier denoted $108_1$ to $108_n$ respectively corresponding to the high frequency amplifier 108 of FIG. 1. In addition each of the high frequency amplification stages includes a respective combiner denoted $110_1$ to $110_n$, corresponding to the combiner 110 of FIG. 1. The interconnection of the difference blocks, high frequency amplifiers, and combiners of the high frequency amplification stages $232_1$ to $232_n$ is the same as that as illustrated in FIG. 1.

The low frequency amplification stage 234 operates in combination with each of the high frequency amplification stages $232_1$ to $232_n$ to provide the same functional effect as FIG. 1, to provide a modulated power supply voltage on the respective lines $120_1$ to $120_n$ for the respective individual RF amplifiers.

Thus in accordance with the principles of the invention, as set out with reference to FIG. 2, a single low frequency amplification stage in combination with multiple high frequency amplification stages allows the advantages of a highly accurate tracking system such as illustrated in FIG. 1 to be maintained in a corporate structure.

The single low frequency amplification stage 234 can be made appropriately high powered for delivering signals to multiple low frequency amplification stages. No disadvantage is involved in this, since the low frequency amplification stage is in any event a low-speed stage, due to its characteristics as a switched voltage stage.

However, by separating out the high frequency amplification stages, they may be maintained as small-sized and fast stages, which allows the advantages of high efficiency, highly accurate tracking to be maintained.

Figure 3:
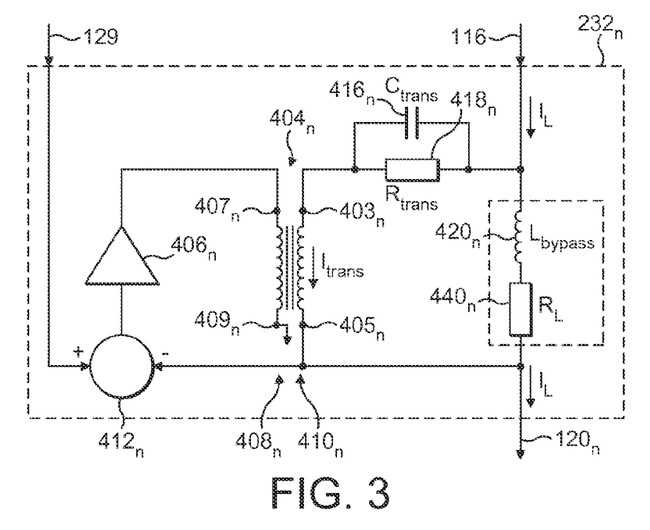
FIG. 3 illustrates an implementation of a further part of the dual-loop control system of FIG. 2 for a multi-stage amplifier in accordance with the principles of the invention.

With reference to FIG. 3, there is now illustrated a preferred implementation of the high frequency amplification stage of FIG. 2, in accordance with the principles of UK patent application no. 0803821.8. The described preferred implementation is a transformer based power supply which is used for modulating the power supplied to a plurality of power amplifiers in an envelope tracking system.

Each of the high frequency stages $232_1$ to $232_n$ is implemented in the same way.

With reference to FIG. 3, a filtered output from the low frequency stage 234 on line 116 is coupled to a first tap $403_n$ of a secondary winding $410_n$ of a transformer $404_n$ via a resistor $418_n$ and capacitor $416_n$ connected in parallel. A second tap $405_n$ of the secondary winding $410_n$ is coupled to the amplifier $202_n$ on output line $120_n$.

A bypass inductor $420_n$ has first and second terminals, the first terminal being coupled to the first tap $403_n$ of the secondary winding $410_n$, and the second terminal being coupled to the second tap $405_n$ of the secondary winding $410_n$ via a resistor $440_n$ representing the resistance of the inductor $420_n$. The illustration of the resistor $440_n$ is for the purposes of later discussion.

The delayed version of the input reference signal on line 129 is coupled to a first input of a subtractor $412_n$, the subtractor $412_n$ having a second input coupled to the second tap $405_n$ of the secondary winding $410_n$. The output of the subtractor $412_n$ is coupled to the input of a correction amplifier $406_n$. The output of correction amplifier $406_n$ is coupled to the first tap $407_n$ of the primary winding $408_n$ of the transformer $404_n$. The second tap $409_n$ of the primary winding $408_n$ is coupled to ground.

In overview, the voltage on line 116 is applied to the first tap $403_n$ of the secondary winding and the first terminal of the bypass inductor $420_n$. The subtractor $412_n$ receives the delayed version of the input reference signal and subtracts the value of the voltage present at the second tap $405_n$ of the secondary winding 110, i.e. the output voltage, to produce a voltage error signal. This voltage error signal is then amplified in the correction amplifier $406_n$ and applied to the first tap $407_n$ of the primary winding $408_n$. The voltage on line 116 and the voltage provided by the correction amplifier $408_n$ are then combined by the transformer $404_n$ to provide a corrected voltage output at the second tap $405_n$ of the secondary winding 410 being the output voltage.

In the arrangement of FIG. 3, the low frequency (switched), or coarse, voltage signal on line 116 is applied to the secondary winding $410_n$ of the transformer, and may cause a significant DC current to flow in the secondary winding. This DC current may generate a significant magnetic flux in the transformer core, and may lead to magnetic saturation of the core.

In order to address this problem, the amplification stage $232_n$ is preferably provided with the bypass inductor $420_n$. The bypass inductor $420_n$ preferably comprises a high power inductor and therefore presents a high impedance to high frequency signals, but a very low impedance to DC current and low frequency signals. Therefore, the bypass inductor presents a low impedance DC current bypass path around the transformer, and a large proportion of the DC current on line 116 will flow through the bypass inductor and not through the transformer. The flux in the transformer core due to the DC current flowing through the transformer windings will be reduced as less DC current flows through the secondary winding. Thus, the susceptibility of the core to magnetic saturation is reduced. This allows a physically smaller transformer, compared with the transformer that would otherwise be required. This is advantageous as a smaller transformer may have an improved high frequency response.

Each amplification stage $232_1$ to $232_n$ may thus be implemented using a transformer as a combiner, but with a reduced size.

The purpose of the capacitor $416_n$ and the resistor $418_n$, is to further provide for the desirable flow of DC current in the bypass inductor.

Bypass inductor $420_n$ has an associated resistance value, $R_L$, due to the length of wire in the inductor coil, represented by resistor $440_n$. This resistance value $R_L$ is normally small. The resistor $418_n$ is preferably chosen to have a resistance value $R_{trans}$ that is greater than $R_L$, preferably much greater. Therefore, DC current output on line 116 will flow preferentially through the low resistance path provided by bypass inductor $420_n$, with its inherent low resistance, $R_L$. The ratio of $R_{trans}$ to $R_L$ then determines the reduction in DC current flowing in the transformer secondary $410_n$.

The resistor $418_n$ thus advantageously provides a means for directing additional current through the bypass path rather than through the transformer.

The capacitor $416_n$ provides a low impedance path for AC current flow through the secondary winding $410_n$ of the transformer $404_n$. By providing a low impedance path for AC currents, excessive dissipation of high frequency signals in resistor $418_n$ may be avoided.

In the advantageous arrangement of FIG. 3, as the flux in the transformer is further reduced, the transformer itself may be further reduced in size whilst avoiding magnetic saturation of the core.

The presence of bypass inductor $420_n$ in the amplification stages $232_1$ to $232_n$ may provide still further benefits.

Assuming a lossless transformer, the average power delivered on line $120_n$ to the amplifier $202_n$ is the combination of the average power delivered by (i) a switchable main voltage source of the low frequency amplifier 104 and (ii) the correction amplifier $406_n$. However, the instantaneous power delivered to the amplifier $202_n$ may not be equal to the sum of the instantaneous power delivered by (i) and (ii). This is because energy is stored in the bypass inductor $420_n$ and in the transformer magnetising inductance (not shown) and this energy may be released during periods of high instantaneous output power.

The majority of the power being delivered to the amplifier $202_n$ at any one point in time is provided by the low frequency amplifier 104. However, during peaks in output power, a significant amount of power is provided by the bypass inductor $420_n$.

The net average power output of the (ideal) bypass inductor must be zero, in order for energy to be conserved. The inductor $420_n$ is 'charged' during periods of low instantaneous output power, and releases the stored-energy during periods of high instantaneous output power. Advantageously, this significantly reduces the peak power requirement of the correction amplifier $406_n$.

Energy which would otherwise be stored in the magnetising inductance of the transformer $404_n$ is instead stored in a physically separate inductor $420_n$, which unlike the transformer $404_n$, does not need to be optimised for high frequency operation. The stored energy may then be delivered to the amplifier $202_n$ during periods of high instantaneous output power, thereby reducing the peak power requirement of the correction amplifier $406_n$.

Figure 4:
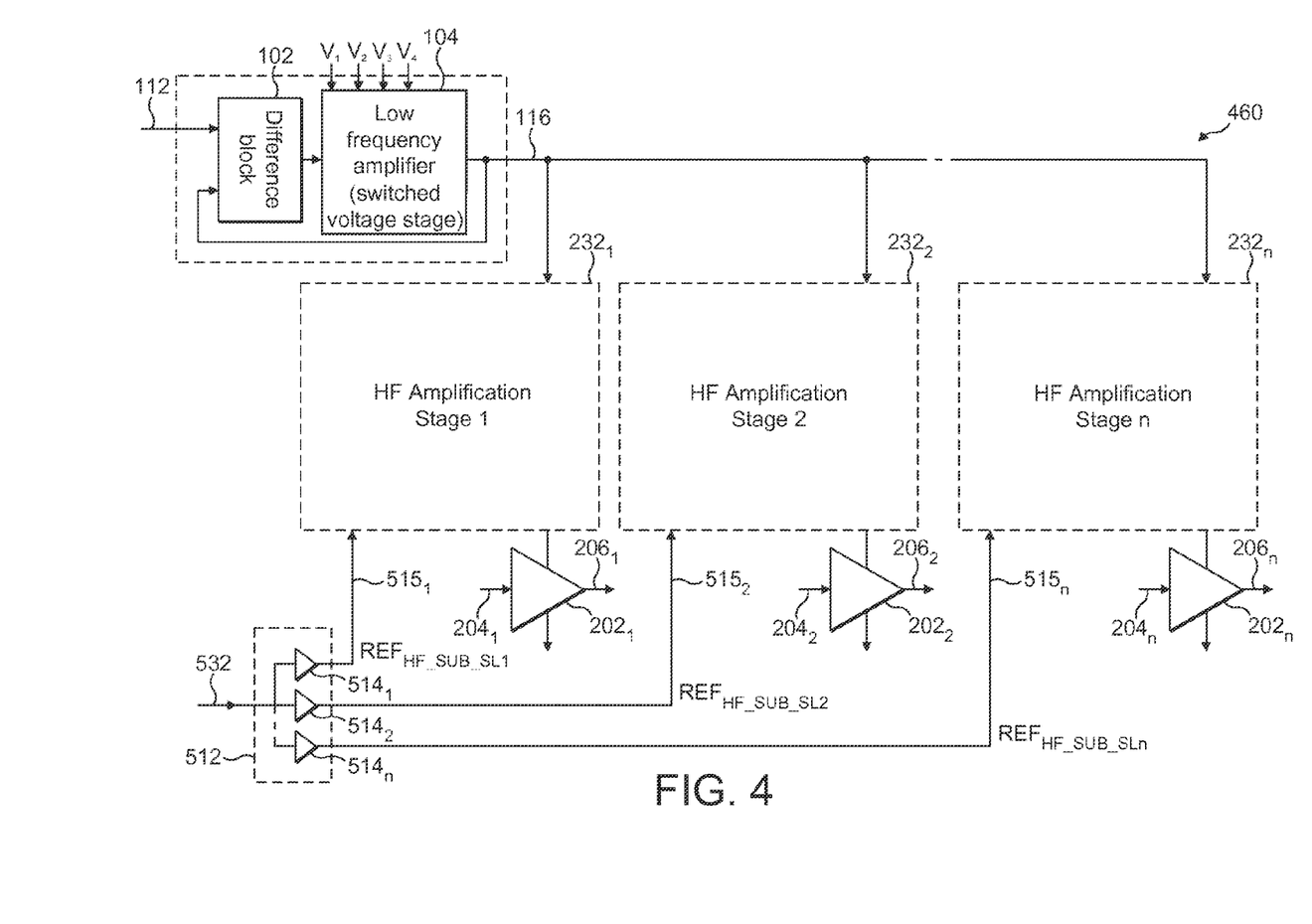
FIG. 4 illustrates an implementation of part of the dual-loop control system of FIG. 5 for a multi-stage amplifier in accordance with the principles of the invention.

With reference to FIG. 4, there is illustrated the implementation detail of the amplification stage 210 of FIG. 2 in a corporate structure. The modified amplification stage 210 of FIG. 2 is denoted by reference numeral 460 in FIG. 4. Reference numerals used earlier in the application are reused in FIG. 4 where like elements are illustrated.

As illustrated in FIG. 4, the delayed version of the reference signal is delivered on a line 532, common to the amplification arrangement 460. The delayed version of the reference signal on line 532 is provided as an input to a splitter stage 512, comprising a plurality of n buffers $514_1$ to $514_n$. Each of the n buffers $514_1$ to $514_n$ receive the delayed version of the reference signal on a line 532, and generate a copy of that signal on their respective output lines $515_1$ to $515_n$. The copies of the delayed version of the reference signal on lines $515_1$ to $515_n$ provide the first inputs of the difference blocks $106_1$ to $106_n$ of FIG. 2 of the high frequency amplification stages $232_1$ to $232_n$. Thus the signal on line 129 shown in FIG. 2 is replaced by n versions of that signal on lines $515_1$ to $515_n$.

The arrangement of FIG. 4 is preferred in a corporate structure, where it is necessary to distribute the reference signal not only to one or more low frequency amplification stages, but to one or more sets of high frequency amplification stages. Due to the distribution of the reference signal in a hierarchical manner in a corporate structure it is necessary to split and then buffer the signal in order to ensure it is delivered to each amplification stage 104 or 232 at an appropriate level.

Figure 5:
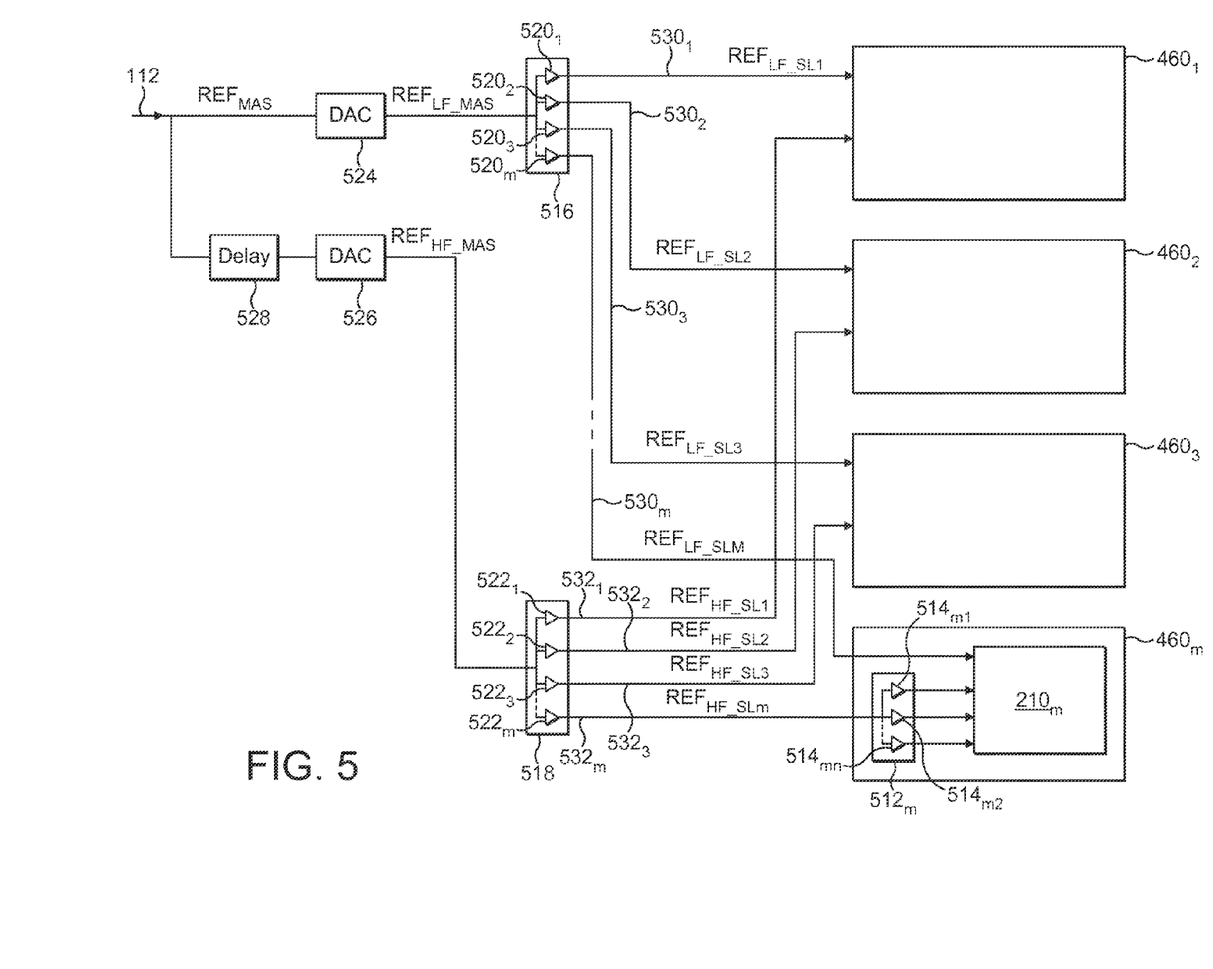
FIG. 5 illustrates schematically a dual-loop control system for a multi-stage amplifier in accordance with the principles of the invention.

With reference to FIG. 5, there is illustrated an overall schematic of the distribution of the reference signal in a corporate structure containing a plurality m of amplification stages corresponding to the amplification stage 460 of FIG. 4.

Turning now to FIG. 5, there is illustrated schematically an implementation of a large corporate structure architecture, comprising multiple amplifiers. In the example of FIG. 5, there is disclosed a plurality m of groups of n amplifiers. n may vary for each group. One of the m group of n amplifiers is preferably arranged as illustrated in FIG. 4.

Each group of n corresponds, in structure, to the amplification stage of FIG. 4. Thus there is shown m amplification arrangements $460_1$ to $460_m$, each corresponding to the arrangement 460 of FIG. 4.

The number of amplifiers n, and consequently the number of high frequency amplification stages n, in each of the stages $460_1$ to $460_n$ may vary.

In general, with reference to FIG. 5, the reference signal on line 112 is provided as an input, and may be denoted the master reference signal, $REF_{MAS}$. The reference signal on line 112 forms an input to a digital-to-analogue converter 524 to provide a digitised version of the analogue reference signal. The digitised version of the reference signal of the output of the digital-to-analogue converter may be considered to be the digitised master reference signal for the low frequency amplification stages, denoted $REF_{LF\_MAS}$, and provides an input to a low frequency splitter/buffer stage 516.

The reference signal on line 112 additionally forms an input to a delay 528, which is equivalent to the delay 131 of FIGS. 1 and 2. The delayed reference signal at the output of the delay 528 forms an input to a digital-to-analogue converter 526, which generates at its output an analogue version of the delayed reference signal, which may be considered to be the analogue master reference signal for the high frequency amplification stages, denoted $REF_{HF\_MAS}$. The reference signal $REF_{HF\_MAS}$ at the output of the digital-to-analogue converter 526 forms an input to a high frequency splitter/buffer stage 518.

The low frequency splitter/buffer stage 516 provides a slave reference signal for the low frequency amplification stages of each of the stages $460_1$ to $460_m$, denoted $REF_{LF\_SL1}$ to $REF_{LF\_SLm}$.

The high frequency splitter/buffer stage 518 provides a slave reference signal for the high frequency amplification stages of each of the multi-stage amplification stages $510_1$ to $510_m$, denoted by $REF_{HF\_SL1}$ to $REF_{HF\_SLm}$.

The low frequency splitter/buffer stage 516 comprises a plurality m of buffers denoted $520_1$ to $520_m$. Each buffer respectively provides an output signal on line $530_1$ to $530_m$ which provides the reference signal $REF_{LF\_SL1}$ to $REF_{LF\_SLm}$ for the low frequency amplification stages of the respective amplification stages $510_1$ to $510_m$.

The high frequency splitter/buffer 518 comprises a plurality m of buffers denoted $522_1$ to $522_m$. The buffers $522_1$ to $522_m$ generate output signals on respective output lines $532_1$ to $532_m$, which respectively provide the high frequency reference signals $REF_{HF\_SL1}$ to $REF_{HF\_SLm}$ for each of the amplification stages $460_1$ to $460_m$.

Each of the high frequency reference signals received on lines $532_1$ to $532_m$ by the amplification stages $460_1$ to $460_m$ is received at a respective buffer stage $512_1$ to $512_m$. In amplification stages $460_1$ to $460_3$ of FIG. 5, as can be seen with further reference to FIG. 4, there is generated for each of the n slave reference signals for the high frequency amplification signals on lines 532 sub-slave signals $REF_{HF\_SUB\_SL1}$ to $REF_{HF\_SUB\_SLn}$.

The number of amplifiers n provided in any amplification stage $460_m$ may be dependent upon the number of times the high frequency reference signal can be replicated by any given buffer stage 512. This limitation may require the hierarchical generation of the high frequency reference voltage, such as illustrated in FIG. 5 where an initial split of the high frequency amplification signal takes place in block 518, and a subsequent split takes place in blocks 512.

The factors most likely to drive this, however, are space within an amplifier rack, or a conveniently achievable power from the low frequency switched supply, which determines the number of amplifiers an individual low frequency switched supply can support.

Thus as is illustrated in FIG. 5, the advantageous structure for a multi-stage RF amplification stage as illustrated in FIG. 4 may be replicated a number of times. If the number of high frequency amplification stages $232_n$ reaches a maximum, due to performance limitations, then the overall amplification stage 460 of FIG. 4 can be replicated as denoted in FIG. 5.

In implementing the principles of the present invention, with a distributed arrangement for the implementation of the high frequency amplification stages, it is necessary to ensure that the timing between the various high frequency amplification stages is controlled, such that synchronisation exists between the application of the signals and that in a subsequent combining stage the signals are combined with time synchronicity.

It is a requirement to (a) accurately align the RF envelope and drain voltage (supply) signals for each amplifier stage used and (b) accurately time-align all power amplifier stages within the corporate structure amplifier.

This is now further discussed with reference to FIG. 6.

Figure 6:
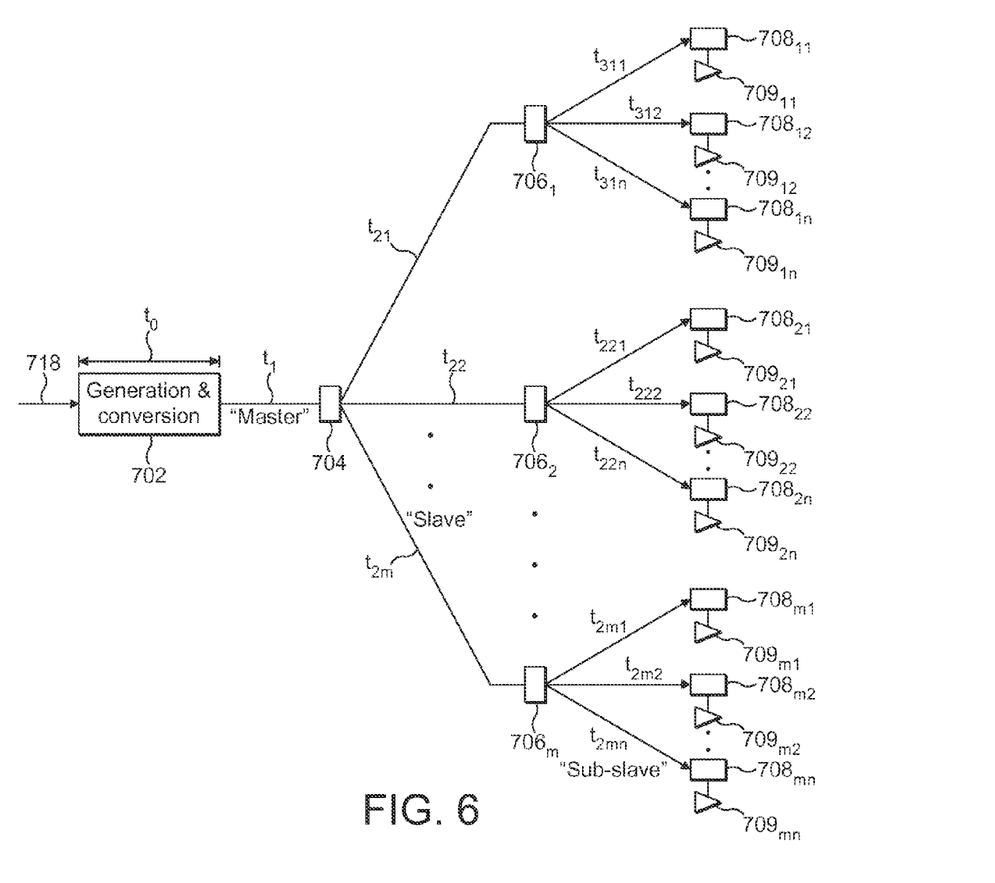
FIG. 6 illustrates aspects of the timing control of a dual-loop control system for a multi-stage amplifier in accordance with the principles of the invention.

FIG. 6 illustrates in overall schematic the distribution of the high frequency amplification stages of the envelope path of a corporate structure envelope tracking amplifier. In FIG. 6 the input reference signal is received on a line 718. This forms an input to a generation and conversion block 702. This block represents the processing of the input reference signal in order to convert it from digital-to-analogue form, and to generate the "master" high frequency reference voltage. This also includes the application of any appropriate delay in the envelope path (corresponding to the delay of block 131 in FIG. 1).

It is also necessary to delay the RF path correspondingly to achieve alignment between the RF envelope and drain (supply) voltage on all power amplifier stages.

Thereafter the "master" version of the high frequency reference signal is delivered to a splitter 704, which is equivalent to the splitter/combiner 518 of FIG. 5. In general, the splitter 704 operates to output m copies of the master high frequency voltage signal, which are "slave" high frequency reference signals, each of which forms an input to a respective further splitter/buffer 706$_1$ to 706$_m$, which correspond to the splitter/buffer stages 512$_1$ to 512$_m$ of FIG. 5. Thereafter, each of the splitter stages 706$_1$ to 706$_m$ generates an appropriate number of copies n, which are "sub-slave" high frequency reference signals for the high frequency amplification stages in a multi-stage amplifier. Thus, for example, the splitter stage 706$_m$ generates n copies of the high frequency reference voltage which provides inputs to the high frequency amplification stage 708$_{m1}$ to 708$_{mn}$. Similarly splitter 706$_2$ provides copies of the high frequency reference voltage to high frequency amplification stage 708$_{21}$ to 708$_{2n}$, and splitter 706$_1$ provides copies of the high frequency voltage reference to high frequency amplification stage 708$_{11}$ to 708$_{1n}$.

As shown in FIG. 6, each of the high frequency amplification stage 708 provides a modulated supply voltage to an associated RF amplifier, denoted by reference numerals 709$_{11}$ to 709$_{mn}$. With reference to FIG. 2, this corresponds to the provision of the modulated supplies on lines 120.

As noted hereinabove, it is important to ensure that the delivery of the reference signal, or copies of the reference signal, to the high frequency RF amplification stages 708 is time-aligned.

In FIG. 6, there is denoted between the various block elements time periods which represent time delays at various points. There is a time delay of $t_0$ associated with the generation and conversion block 702. A further time delay of $t_1$ represents a delay caused by the transmission from the generation and conversion block 702 to the splitter 704. There is a respective time delay between the splitter 704 and each of the splitters 706$_1$ to 706$_m$, each of which time delays is denoted by the times $t_{21}$, $t_{22}$, and $t_{2m}$ respectively. Further there is a time delay between each of the splitters 706$_1$ to 706$_m$, and the respective amplifiers 708$_{11}$ to 708$_{1n}$, 708$_{21}$ to 708$_{2n}$, and 708$_{m1}$ to 708$_{mn}$.

It will be appreciated by one skilled in the art that the number of RF amplifiers 709 and associated high frequency amplification stages 708 is such that additional hierarchical generation of the high frequency voltages may be required, and there may be additional stages incurring time delays. FIG. 6 is merely representative of the principle of the delivery of the high frequency reference signal from a master version of such through to the individual high frequency amplification stages of the multi-stage environment. There may be more or less splitting stages required, and thus more or less time delay paths.

In order to ensure time-alignment of the high frequency amplification stages, it is necessary to ensure that the time delay between the receipt of the reference signal on line 718 and the delivery of the copy of the reference signal to an individual high frequency amplification stage 708 are equal. Thus the time delay from the input of the generation and conversion block 702 to the input to any one of the high frequency amplification stages 708 associated with the amplifiers 709 must be equal. For example, this requires $t_0+t_1+t_{21}+t_{31n}$ to be equal to $t_0+t_1+t_{22}+t_{222}$.

Further it is important that the envelope of the RF signal of each RF amplifier 709 is time-aligned with the modulated supply voltage provided by each high frequency amplification stage, such that there is time-alignment between the modulated supply provided to an amplifier and the RF signal being carried by the amplifier. It should be noted that the input signal to each amplifier 709 will be derived from a main input signal being split and distributed, in a similar manner to the reference signal for the high frequency amplification stages in FIG. 6.

It is preferable, though not essential, that the reference signal for any low frequency amplification stage be time-aligned with the high-frequency reference signals and the input signals. Such time-alignment is less critical as the high frequency amplification stage is adapted to remove any error in the signal generated by the low frequency amplification stage.

In order to meet the time-alignment requirements, it may be necessary to take appropriate action to ensure time periods are time-aligned by introducing delays such as by controlling the length of cables for delivering signals.

The described preferred embodiments utilising an RF amplifier are not limited to any particular load being driven by such RF amplifier. However it is envisaged that such an RF amplifier will typically drive an antenna. As such, the present invention has particular advantageous uses in the field of communications, including the field of mobile communications.

The present invention is described herein by way of reference to particular preferred embodiments, and particularly by way of reference to an application in a modulated voltage supply. This description is, however, only illustrative of examples. In particular the invention may be implemented more broadly in control systems. Envisaged, but not limiting, applications include dynamic power supplies or any wide frequency range power supply.

The invention claimed is:

1. A power supply stage, comprising:
   a plurality of amplifiers for amplifying an input signal, each amplifier receiving a power supply voltage;
   a common switched voltage stage for selecting one of a plurality of power supply voltages in dependence on a reference signal representing a desired power supply voltage; and
   a plurality of adjusting stages, corresponding to the plurality of amplifiers, adapted to generate an adjusted selected power supply voltage for a respective amplifier tracking the reference signal in dependence on the one selected power supply voltage and the reference signal.

2. The power supply stage of claim 1 in which the plurality of adjusting stages each comprise an error correction stage.

3. The power supply stage of claim 2 in which each adjusting stage is adapted to receive the adjusted selected power supply and compare it with the reference signal, to thereby generate an error signal to be added to the selected power supply voltage.

4. The power supply stage of claim 1 further comprising a splitter for providing the reference signal to each adjusting means, which splitter provides a plurality of copies of the reference signal for the respective adjusting stages.

5. The power supply stage of claim 1 further comprising a plurality of said common switched voltage stages each associated with a plurality of amplifiers and a plurality of adjusting stages.

6. The power supply stage of claim 5 further comprising:
   a first splitter/buffer stage for distributing the reference signal to the plurality of common switched voltage stages;
   a second splitter/buffer stage for distributing the reference signal to the plurality of adjusting stages associated with each common selection means; and
   a buffer for distributing the reference signal distributed to each plurality of adjusting stages to each individual adjusting stage.

7. The power supply stage of claim 1 in which there is provided a delay stage for controlling the timing of the reference signal at each of the adjusting stages such that the adjusted supply voltage for each amplifier is time-aligned to the signal being carried by each amplifier.

8. The power supply stage of claim 7 wherein the delay stage further controls the timing of the reference signal at the common switched voltage stage.

9. The power supply stage of claim 1 wherein each adjusting stage comprises a combiner for combining the selected power supply voltage with a correction voltage to generate the adjusted selected power supply voltage.

10. The power supply stage of claim 9 wherein each adjusting stage comprises a difference block for determining the correction voltage in dependence on the difference between the reference signal and the adjusted selected power supply voltage.

11. The power supply stage of claim 10 wherein each adjusting stage comprises an amplifier for amplifying the correction voltage.

* * * * *